United States Patent [19]
Kim et al.

[11] Patent Number: 6,147,534
[45] Date of Patent: Nov. 14, 2000

[54] DYNAMIC SET/RESET CIRCUIT WITH DUAL FEEDBACK

[75] Inventors: Song Kim, Santa Clara; Hao Chen, Fremont, both of Calif.

[73] Assignee: Sun Microsystems, Inc., Palo Alto, Calif.

[21] Appl. No.: 09/338,809

[22] Filed: Jun. 23, 1999

Related U.S. Application Data

[62] Division of application No. 09/037,251, Mar. 9, 1998, Pat. No. 5,952,859.
[51] Int. Cl.[7] .................................................. H03K 3/037
[52] U.S. Cl. ......................... 327/200; 326/112; 326/121
[58] Field of Search .................................. 327/200, 199, 327/201, 208–212, 217, 218; 326/94–98, 104, 112, 114, 115, 119–121

[56] References Cited

U.S. PATENT DOCUMENTS 5,708,374  1/1998  Durham et al. ............................ 326/93
5,760,610  6/1998  Naffziger ................................... 326/93

Primary Examiner—Tuan T. Lam
Attorney, Agent, or Firm—William J. Kubida, Esq.; Stuart T. Langley, Esq.; Hogan & Hartson LLP

[57] ABSTRACT

A dynamic set/reset circuit is provided with a first feedback line and a second feedback line. The first feedback line provides an interlocked feedback signal which permits high frequency operation of the set/reset circuit. The second feedback line prevents the interlocked feedback signal from causing the circuit to improperly change state until the next cycle of the circuit. In this manner, the circuit will operate properly despite an unexpectedly wide pulse on an input line. The dual feedback can be used on the set or reset inputs of a set/reset circuit, or both, and the set/reset circuit can be used in various logic and high speed applications, such as within a microprocessor.

12 Claims, 11 Drawing Sheets

ELIMINATED COLLISION CURRENT/MULTIPLE RESET PROBLEM

DYNAMIC SET/RESET CIRCUIT WITH DUAL FEEDBACK

This application is a division of application Ser. No. 09/037,251, filed Mar. 9, 1998 now U.S. Pat. No. 5,952,859.

BACKGROUND OF THE INVENTION

1. Field of the Invention

This invention relates in general to electronic circuits, and more particularly, to dynamic set/reset circuits used within semiconductor logic devices, memory, or processors.

2. Relevant Background

In the design of semiconductor logic, memory, or processors/microprocessors, integrated circuit designers utilize a number of basic circuit designs as building blocks for implementation of various logic structures within the integrated circuit. For example, dynamic set/reset circuits are used as logic circuits, or in memory or processors for storing a value and then clearing or resetting the value during a time period or cycle.

A conventional dynamic set/reset circuit is shown in FIG. 1A. A normal sequence of operations would involve providing the circuit with a data input, evaluating the data in the circuit (i.e., providing stable data at the output), and then resetting the circuit with a reset signal so that the circuit will be ready for a new data input on the next cycle. Transistor 20 receives the data input, while transistor 22 receives the reset signal. Transistor 20 accepts an active high data input at its gate and provides a logic high level at the output 24, through inverter I1, if the input to transistor 22 is inactive. Inverter I2 is used to maintain the state of the signal at the evaluate node, labeled "EVAL" in the figures, when both inputs are inactive. Upon the input to transistor 20 going low, an active low signal applied to the gate of transistor 22 will reset the output. In order to ensure that stable data is provided at the output to overcome temperature variations or other adverse conditions, the width of the data pulse or the reset pulse can be enlarged. This is typically referred to as margin checking. However, by widening the pulses, the overall cycle time of the circuit is increased which makes such a design undesirable for high-frequency applications.

FIG. 1B shows the circuit of FIG. 1A with a single feedback line used to improve the frequency of the circuit. Assuming that the input signal 46 is low, whenever the RESET line 30 goes high, the output of the transistor 32, shown as the EVAL signal 40, goes high and the feedback signal 34, shown as FB, goes low and maintains a low input to the NAND gate 36, which inactivates transistor 32. The state of the EVAL node is now maintained high through inverters I1 and I2 and the feedback circuit. In this manner, the single feedback can be used to reduce the required pulse width of the RESET signal, and improve the frequency of the set/reset circuit.

While the circuit of FIG. 1B improves the circuit's frequency, one possible problem with the circuit shown in FIG. 1B is that the circuit could experience multiple resets if the timing of the externally provided reset input is not well controlled, possibly resulting in functional failure or improper operations of the circuit.

FIG. 1C show a timing diagram for the circuit shown in FIG. 1B illustrating one scenario where multiple resets occur from a wide reset pule. The cycle begins on a rising edge of the active high RESET signal where the input signal IN is low. The PC_1 signal, being the output of the NAND gate 36, goes low and turns on the transistor 32 which sets the EVAL signal 40 high. The OUTPUT signal 42 then goes low, as does the FB feedback signal 34. Since the FB signal 34 input to the NAND gate 36 is low, the PC_1 signal 44 goes high.

When the IN input signal 46 is asserted high while the RESET signal 30 is high, the transistor 38 turns on which sets the EVAL signal 40 low and the OUT output signal 42 high. The FB feedback signal 34 then goes high, which sets the PC_1 signal 44 back to low since the inputs to the NAND gate 36 are both high.

The problem is that the feedback signal should not change state again until after another rising edge of the RESET signal (i.e., the circuit reset should occur only once per cycle while the RESET signal is high). The multiple reset problem occurs in the circuit of FIG. 1B when the RESET pulse is still active while data is placed in the input 46 and the circuit evaluates the data at the input pin 46. Since the FB signal is high and the RESET signal is high, the PC_1 signal 44 changes state to a logic low which turns on the transistor 44 and begins to pull the EVAL signal 40 high and the OUT signal 42 low. The FB signal 34 then also begins to go low. However, the IN input signal 46 is being externally driven high which turns the transistor 38 on and tends to pull the EVAL signal 40 low. Hence, there is a "collision" since the EVAL signal is being pulled low by the transistor 38 while the transistor 32 pulls EVAL high. The effect of the multiple reset problem is that the pulse width of the OUT output signal 42 is erroneously reduced, which could cause a erroneous data to be read from the set/reset circuit shown in FIG. 1B.

A similar problem involving multiple evaluates can occur in a set/reset circuit if a set input line has a pulse width too wide. The circuit may evaluate the input data twice during a single cycle, which may be problematic.

What is needed is a dynamic set/reset circuit for high-frequency applications which protects against multiple resets or multiple evaluates of the circuit whenever an input reset pulse, or an input set pulse, is unexpectedly wide in pulse width. It is with the shortcomings of the existing art in mind that the significant improvements and advancements of the present invention were developed.

SUMMARY OF THE INVENTION

In light of the above, therefore, according to a broad aspect of the invention, two feedback lines are provided in a set/reset circuit so that only one evaluate or reset occurs in a single cycle without collision, and the circuit can be used in high frequency applications. The first feedback line provides for high frequency operation. The second feedback line prevents multiple resets or multiple evaluates from occurring within the circuit during a single cycle. The robustness of the set/reset circuit is enhanced, thereby permitting substantial elimination of any margin checking, while allowing use of the circuit in high frequency applications.

According to one broad aspect of the present invention, a circuit for eliminating multiple resets from occurring during a single cycle of the circuit includes a first switching device having a gate connected to an input signal, a source coupled to ground, and a drain. A second switching device has a gate, a drain coupled to the drain of the first switching device at a first node, and a source connected to a supply line of the circuit, where the first node providing an output signal. A first logic gate has a first input coupled to the output signal, a second input, and an output, while a second logic gate has a first input coupled to the output of the first logic gate, a second input, and an output. A third logic gate has a first input coupled to a reset line and coupled to the second input of the second logic gate, a second input coupled to the output of the second logic gate and coupled to the second input of the first logic gate, and an output coupled to the gate of the second switching device. In one example, the logic gates can comprise NAND gates and the switching elements can be n-channel and p-channel MOSFETs.

According to another broad aspect of the present invention, a circuit for eliminating multiple data evaluates from occurring during a single cycle of the circuit includes a first switching device having a gate connected to a reset signal, a source coupled to a supply line of the circuit, and a drain. A second switching device has a gate, a drain coupled to the drain of the first switching device at a first node, and a source connected to ground, where the first node providing an output signal. A first logic gate has a first input coupled to the output signal, a second input, and an output, while a second logic gate has a first input coupled to the output of the first logic gate, a second input, and an output. A third logic gate has a first input coupled to an input line and coupled to the second input of the second logic gate, a second input coupled to the output of the second logic gate and coupled to the second input of the first logic gate, and an output coupled to the gate of the second switching device.

In another embodiment of the invention, the dual feedback is applied to both a data input line and a reset input line of a set/reset circuit.

According to another embodiment of the invention, the reset input line is coupled directly to control the gate of a switching element, thereby reducing propagation delays so that the circuit responds more quickly to the reset input line.

According to another embodiment of the invention, the data input line is coupled directly to control the gate of a switching element, thereby reducing propagation delays so that the circuit responds more quickly to the data input line.

In another embodiment of the present invention, a two-input OR function is implemented using the dual feedback principles disclosed herein. A circuit implementing a two-input AND function is also disclosed herein.

The foregoing and other features, utilities and advantages of the invention will be apparent from the following more particular description of a preferred embodiment of the invention as illustrated in the accompanying drawings.

DETAILED DESCRIPTION OF THE PREFERRED EMBODIMENTS

The present invention provides two feedback lines in a dynamic set/reset circuit to ensure data integrity despite a reset input pulse or a set input pulse being unexpectedly wide. As previously explained, such an unexpectedly wide pulse on the reset input or the set input would tend to cause the dynamic set/reset circuit to attempt to improperly reset or evaluate more than once during a single cycle, leading to possibly corrupt output data.

In accordance with one embodiment of the present invention, a dynamic set/reset circuit is provided with a first feedback line and a second feedback line. The first feedback line provides an interlocked feedback signal which permits high frequency operation of the set/reset circuit. The second feedback line prevents the interlocked feedback signal from changing state until the externally applied input signal has changed state. In this manner, only one reset or one evaluate will occur within the set/reset circuit during a single cycle despite an unexpectedly wide pulse on the input.

As used herein, the term "transistor" is defined as a switching element which can include, for example, n-channel or p-channel MOS-FETs, FETs, JFETS, BJTs, or other like switching elements. The particular type of switching element used is a matter of choice depending on the particular application of the circuit, and may be based on factors such as power consumption limits, response time, noise immunity, fabrication considerations, etc. In one example, the present invention utilizes p-channel MOS-FETs and n-channel MOS-FETs.

Figure 2:
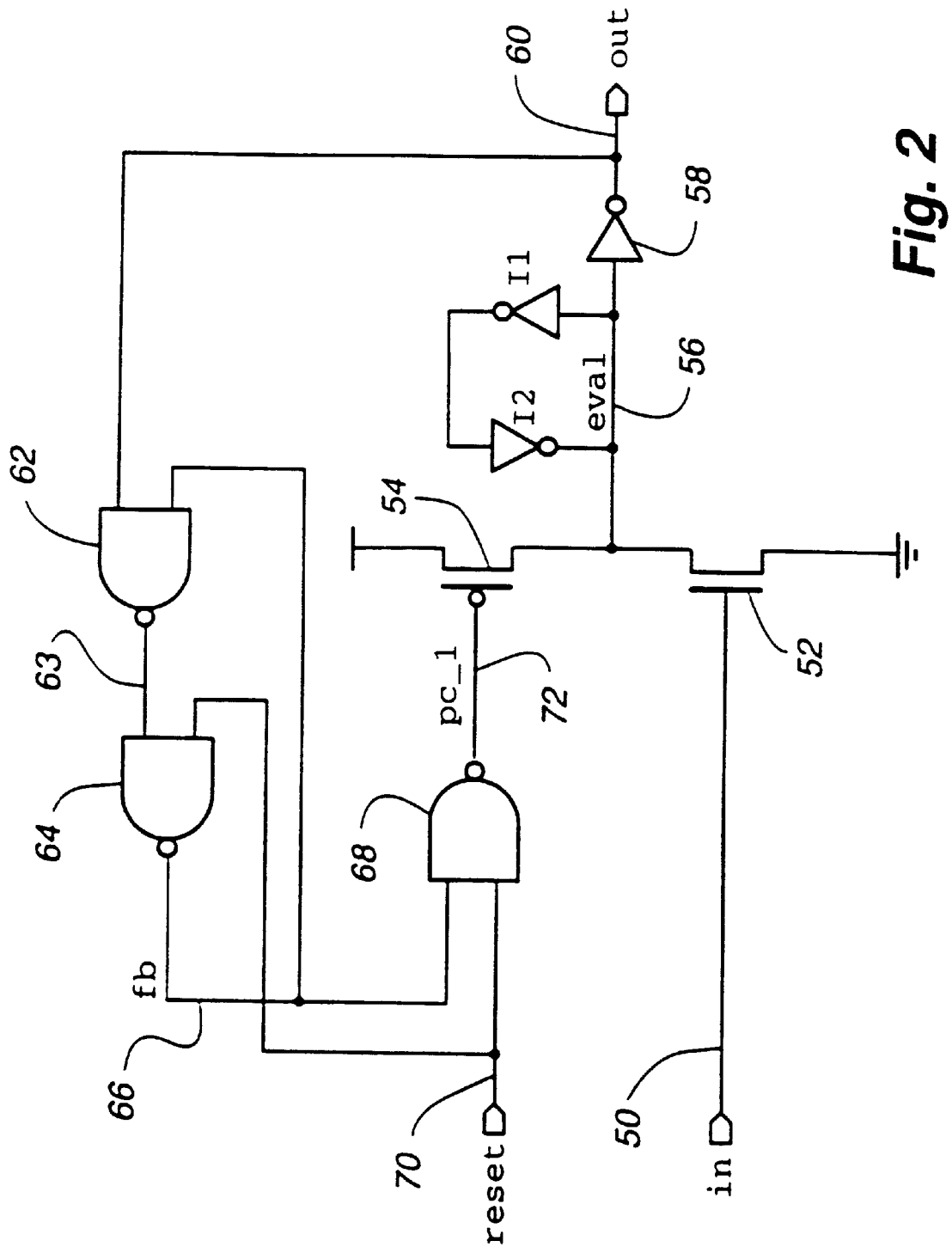
FIG. 2 illustrates a circuit in accordance with one embodiment of the present invention to prevent multiple resets from occurring in a single cycle.

FIG. 2 illustrates one embodiment of the present invention for preventing multiple resets from occurring during a single cycle. An input signal 50, shown as IN, is provided at the gate of transistor 52. The source of transistor 52 is coupled to ground, while the drain is coupled to the drain of transistor 54 at a node which forms the EVAL signal 56 which, through inverter 58, forms the output signal 60. The source of transistor 54 is coupled to the supply line of the circuit. In one example, transistor 52 is a n-channel MOSFET, while transistor 54 is a p-channel MOSFET.

Inverters I1 and I2 are provided to maintain the states of the EVAL signal. The output signal 60 is coupled to a first input of NAND gate 62. The output 63 of NAND gate 62 is coupled to a first input of NAND gate 64. The output of NAND gate 64 forms the feedback signal 66 coupled to an input of NAND gate 68. The feedback signal 66 is also coupled to the second input of NAND gate 62. The externally-provided RESET input signal 70 is coupled to the second input of NAND gate 64 and to the second input of NAND gate 68. The output signal 72 of NAND gate 68, shown as PC_1, is coupled to the gate of transistor 54.

Figure 1A:
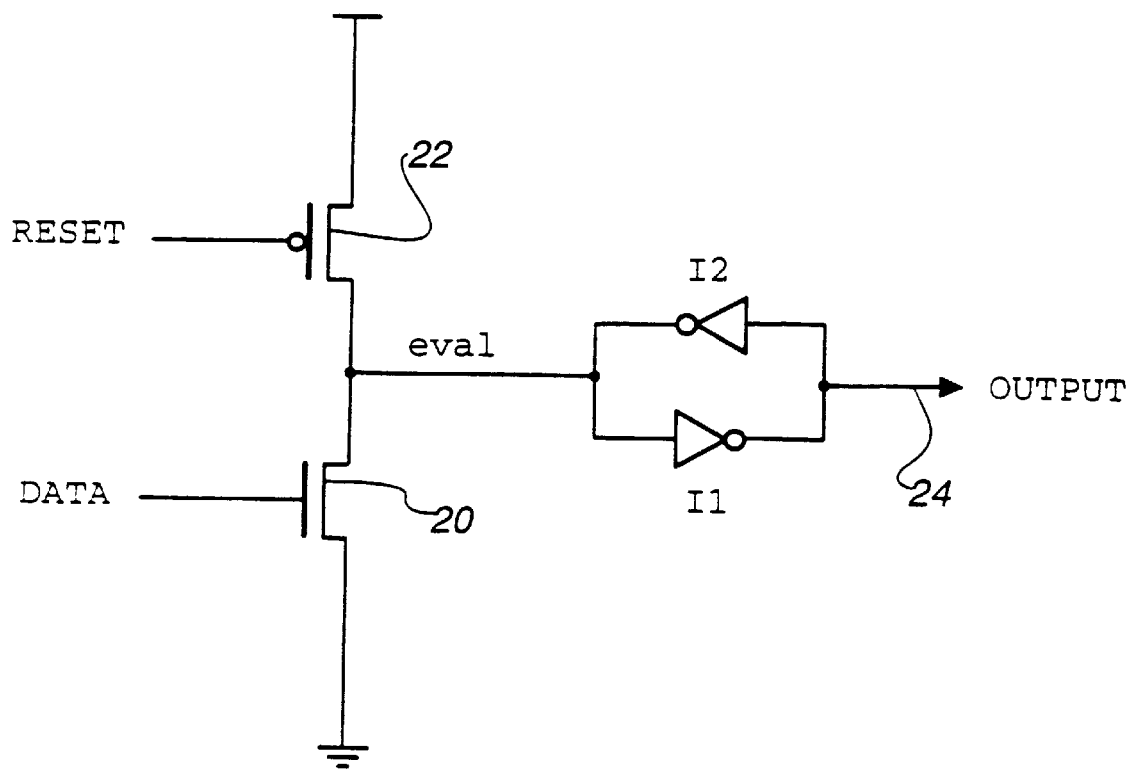
FIG. 1A illustrates a conventional set/reset circuit which does not utilize feedback.
Figure 1B:
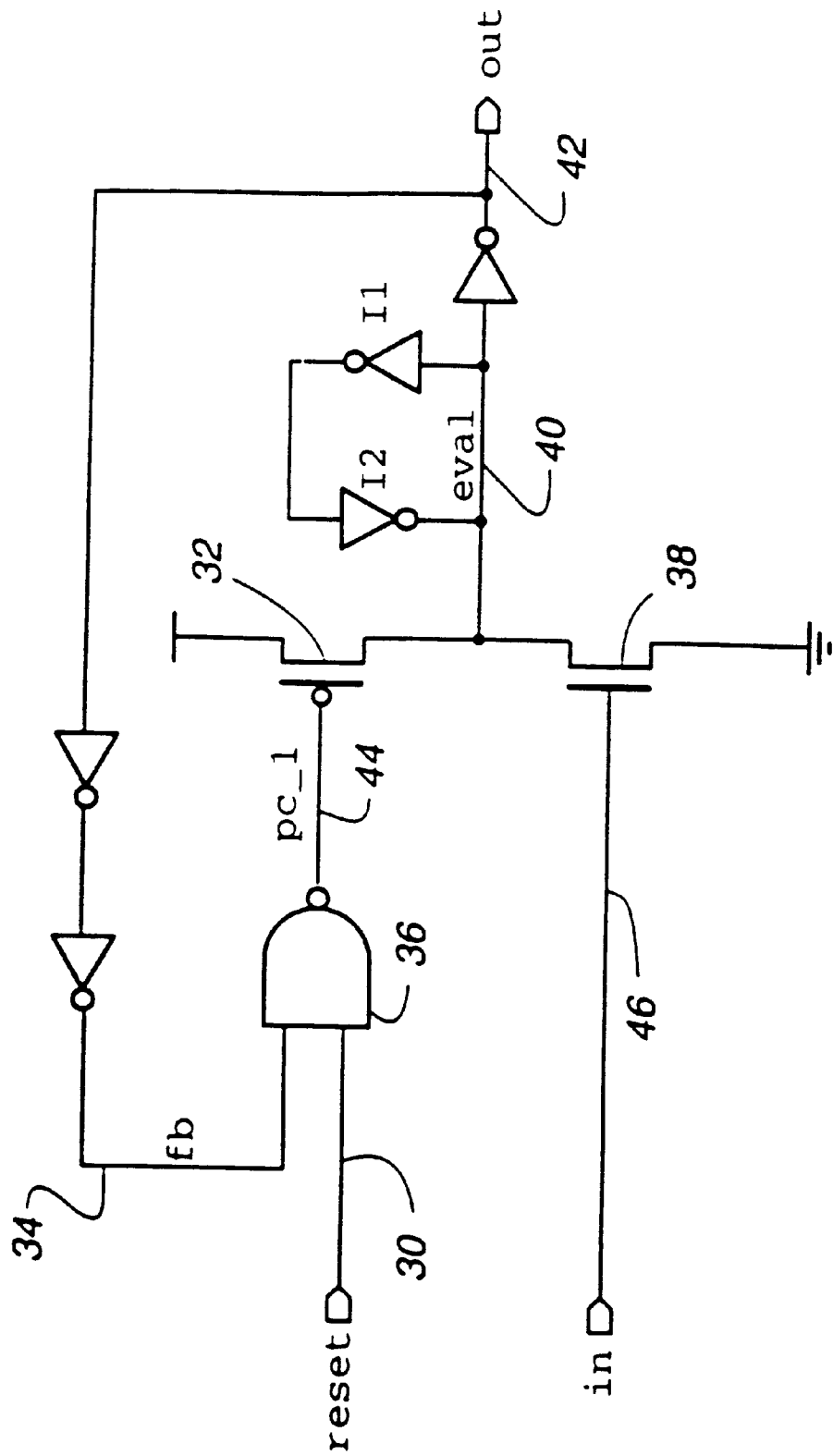
FIG. 1B illustrates a set/reset circuit which utilizes a single feedback line to increase the frequency of the circuit.
Figure 1C:
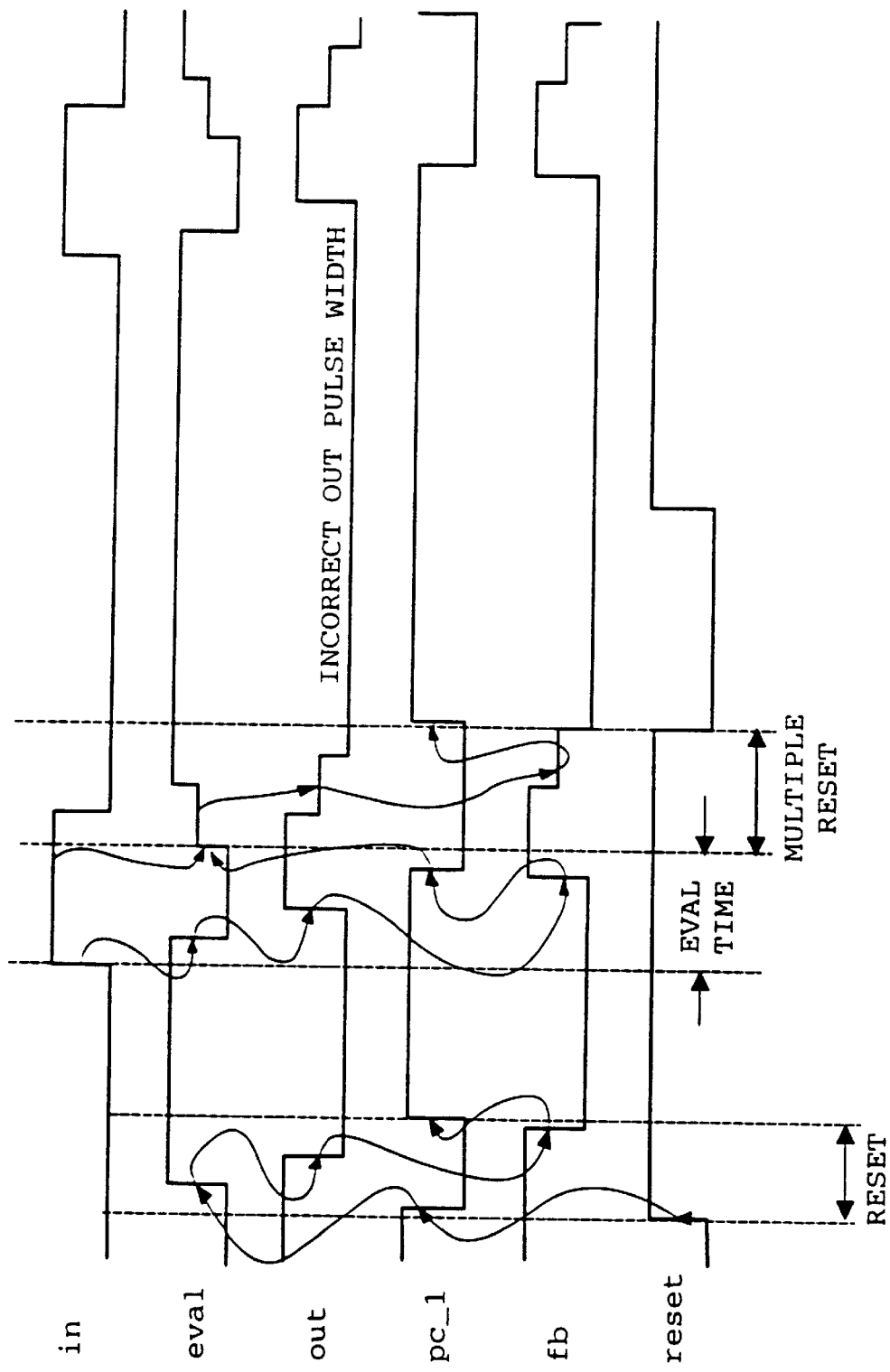
FIG. 1C illustrates a timing diagram of the set/reset circuit of FIG. 1B showing one scenario under which the circuit will experience a multiple reset and possibly provide erroneous output data.

In accordance with the present invention, two feedback paths are provided in the circuit of FIG. 2. A first feedback path is provided to increase the frequency of the circuit, and is formed from the output signal 60 through NAND gate 62 along line 63 through NAND gate 64 along line 66 to NAND gate 68 which drives transistor 54. The operation of this feedback path is described above with reference to FIG. 1B. A second feedback path is provided to eliminate the multiple reset problem during a single cycle of the circuit, and is formed by tapping off of the feedback signal 66 into NAND gate 62, along line 63 through NAND gate 64 along feedback signal 66 into NAND gate 68. The RESET line 70 is also tapped and coupled to an input of NAND gate 64.

Figure 3:
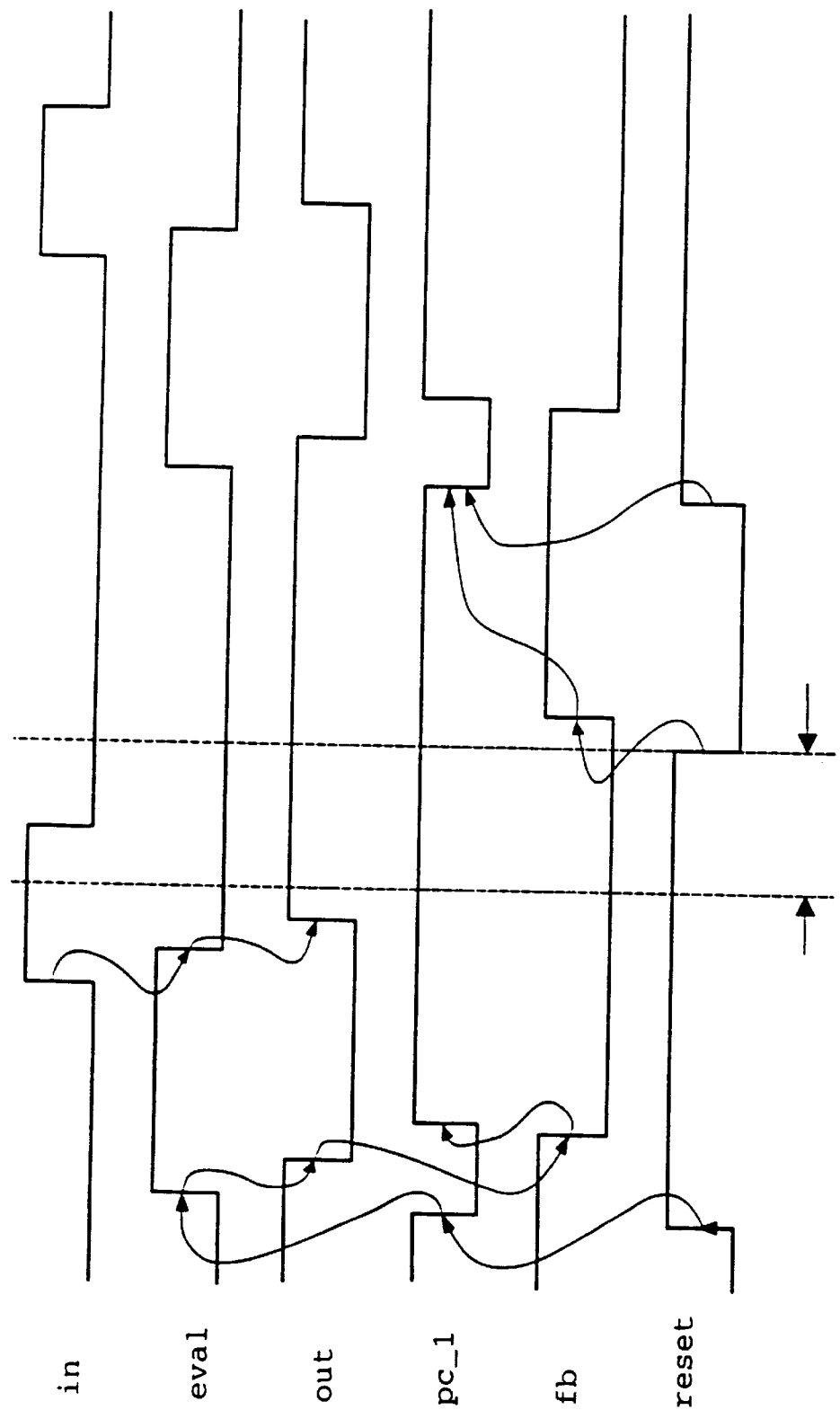
FIG. 3 illustrates a timing diagram of the inventive circuit of FIG. 2 showing how the scenario shown in FIG. 1C is corrected so that multiple resets are avoided during a single cycle and proper output data is provided.

The operation of the circuit of FIG. 2 will be described with reference to the timing diagram shown in FIG. 3. The cycle begins on a rising edge of the active high RESET signal 70. Once the reset of the EVAL signal 56 is complete, new data can be presented to the input IN (i.e., to the gate of transistor 52 in FIG. 2). In particular, the circuit begins to reset upon falling edge of the PC_1 signal and terminates its reset upon a rising edge of the PC_1 signal as shown in FIG. 3. The circuit then evaluates data upon activation (rising edge) of the IN input signal. After the data present at the input 50 has been evaluated and provided to the output 60, the cycle is complete and the next cycle begins upon the next rising edge of the RESET signal 70.

Beginning with the rising edge of the RESET singal and referring to FIGS. 2 and 3, assuming the input signal 50 is low, the PC_1 signal 72, being the output of the NAND gate 68, goes low and turns on the transistor 54 which sets the EVAL signal 56 high and resets the OUTPUT signal 60 to a low logic level. When the output signal 60 is at a low state, the feedback path used to increase the circuit frequency will pull PC_1 signal 72 high and inactivate transistor 54, thereby completing the reset process.

Since the OUTPUT signal 60 is reset to a low logic level, the signal 63 of NAND gate 62 is forced high, and the FB signal 66 goes low. The feedback signal FB 66 is now locked to a low logic level and will not go high until the RESET signal 70 goes low during the next cycle, thereby preventing a multiple reset of the circuit in a single cycle.

Accordingly, since the FB signal 66 is low, the PC_1 signal 72 goes high and turns off and deactivates transistor 54. Once transistor 54 has been deactivated when PC_1 signal goes high, the circuit is no longer in reset mode. As a conseqeuence of providing the second feedback path, multiple resets are prevented as only one reset per cycle occurs.

Because the low maintained on the FB signal 66 will force transistor 54 off, the EVAL signal line 56 can be controlled by the input signal 50 through transistor 52. When the input signal 50 is asserted while the PC_1 signal 72 is high, transistor 52 turns on which sets the EVAL signal 56 low and the output signal 60 high. As mentioned above, the FB signal 66 is locked to a low logic level and will not go high until the RESET signal 70 goes low. Hence, even if the output signal 60 is set high, the logic state of the feedback line 66 will not be affected, and correspondingly any collisions between transistors 52 and 54 will be avoided.

When the RESET line 70 is set to a logic low, NAND gate 64 will set the feedback FB signal 66 high, and NAND gate 68 will maintain the PC_1 signal 72 high until the next rising edge of the RESET signal 70 during the next cycle. When the PC_1 line 72 then goes high, the circuit is now ready to receive new data. Hence, the circuit shown in FIG. 2 having the double feedback can be used in high frequency applications without becoming corrupt with invalid data if the externally applied reset pulse is unexpectedly wide.

Figure 4:
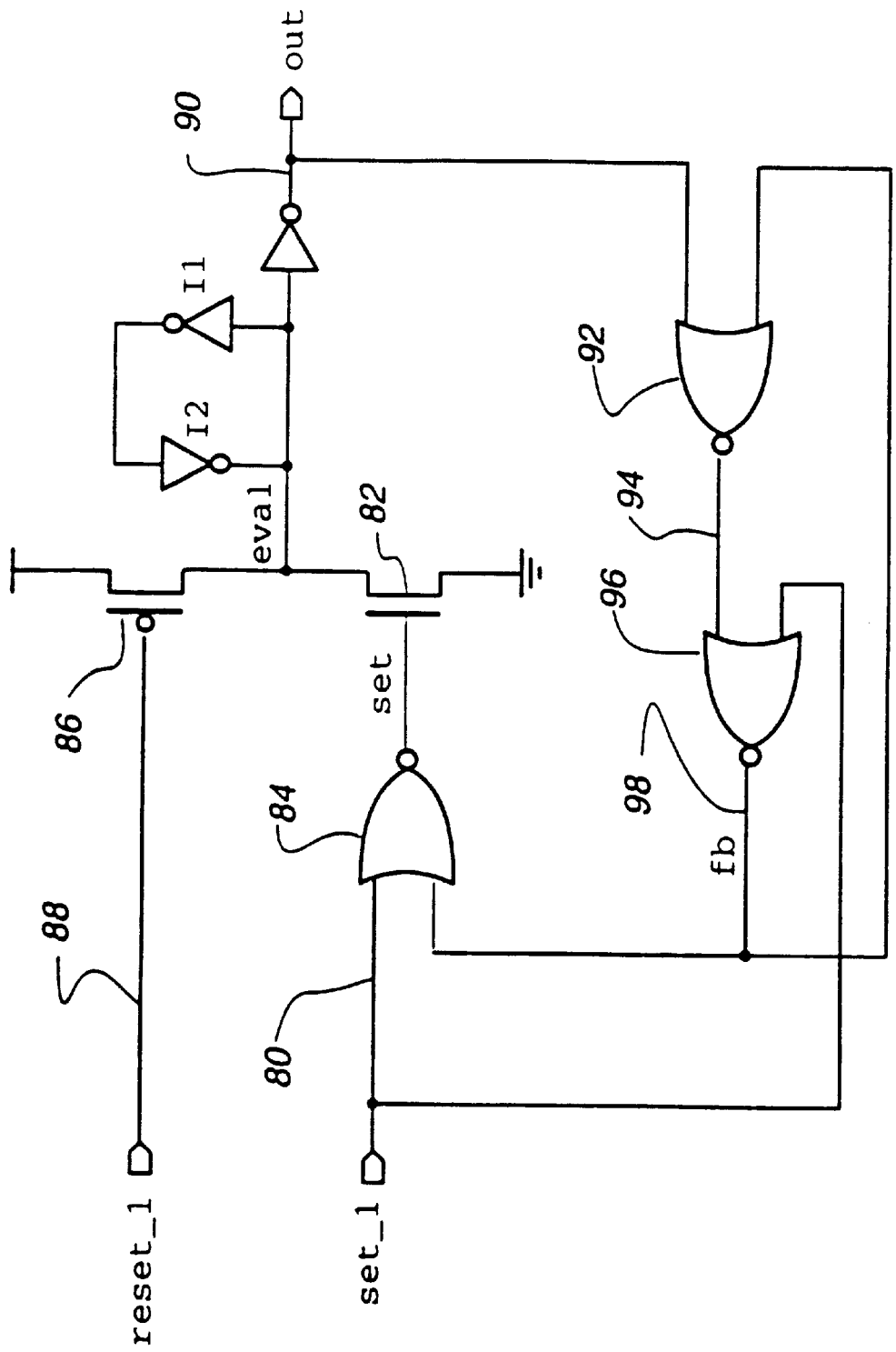
FIG. 4 illustrates a circuit in accordance with another embodiment of the present invention where the double feedback is provided along the data input to prevent multiple evaluates from occurring during a single cycle.

FIG. 4 illustrates a circuit in accordance with another embodiment of the present invention where the double feedback is provided along the data ($SET_{13}$ 1) input 80 to prevent multiple evaluates from occurring during a single cycle. In a manner similar to the multiple reset problem described above, if an input pulse on the set input of a set/reset circuit is too wide in pulse width, the circuit can suffer from multiple evaluates during a single cycle, resulting in erroneous output data. The circuit of FIG. 4 is designed to prevent contention between transistor 82, coupled to the SET_1 signal 80 through NOR gate 84, and transistor 86 whose gate is coupled to the RESET line 88.

In accordance with the present invention, two feedback paths are provided in the circuit of FIG. 4. A first feedback path is provided to increase the frequency of the circuit, and is formed from the output signal 90 through NOR gate 92 along line 94 through NOR gate 96 along line 98 into NOR gate 84 which drives transistor 82. A second feedback path is provided to eliminate the multiple set/evaluate problem during a single cycle of the circuit, and is formed by tapping off the feedback signal 98 into NOR gate 92, along line 94 through NOR gate 96 along feedback signal 98 into NOR gate 84. The SET_1 line 80 is also tapped and coupled to an input of NOR gate 96. This second feedback path ensures that transistor 82 is not activated more than once per cycle of the circuit.

Figure 5:
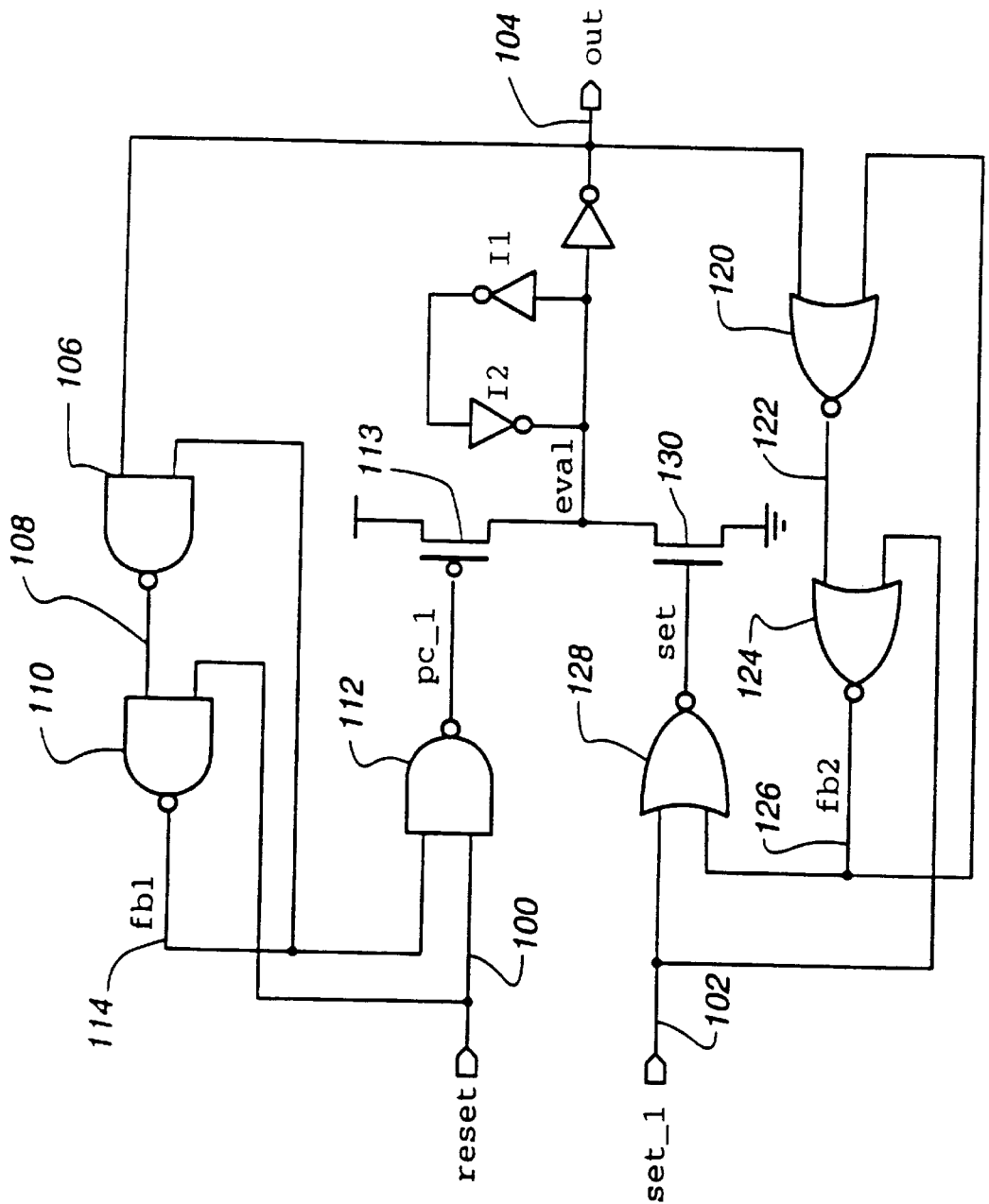
FIG. 5 illustrates a circuit in accordance with another embodiment of the present invention where double feedback is provided along the reset input and double feedback is provided along the data input to prevent both multiple resets and multiple evaluates from occurring in a single cycle.

FIG. 5 illustrates a circuit in accordance with another embodiment of the present invention where double feedback is provided along the RESET input 100, and double feedback is provided along the data (SET_1) input 102, to prevent both multiple resets and multiple sets/evaluates from both occurring during a single cycle of the circuit.

Four feedback paths are provided in the circuit of FIG. 5—two feedback paths provided along the RESET input 100, and two feedback paths along the SET_1 input 102. With respect to the RESET input 100, a first feedback path is provided to increase the frequency of the circuit, and is formed from the output signal 104 through NAND gate 106 along line 108 through NAND gate 110 along line 114 to NAND gate 112 which drives transistor 113. This first feedback path increases the circuit's frequency as described above. A second feedback path is provided to eliminate the multiple reset problem during a single cycle of the circuit, and is formed by tapping off of the feedback signal 114 into NAND gate 106, along line 108 through NAND gate 110 along signal 114 into NAND gate 112. The RESET line 100 is also tapped and coupled to an input of NAND gate 110.

With respect to SET_1 input signal 102, a third feedback path is provided to increase the frequency of the circuit, and is formed from the output signal 104 through NOR gate 120 along line 122 through NOR gate 124 along line 126 into NOR gate 128 which drives transistor 130. A forth feedback path is provided to eliminate the multiple set/evaluate problem during a single cycle of the circuit, and is formed by tapping off the feedback signal 126 into NOR gate 120, along line 122 through NOR gate 124 along feedback signal 126 into NOR gate 128. The SET_1 line 102 is also tapped and coupled to an input of NOR gate 124. This forth feedback path ensures that transistor 130 is not activated more than once per cycle of the circuit.

Figure 6:
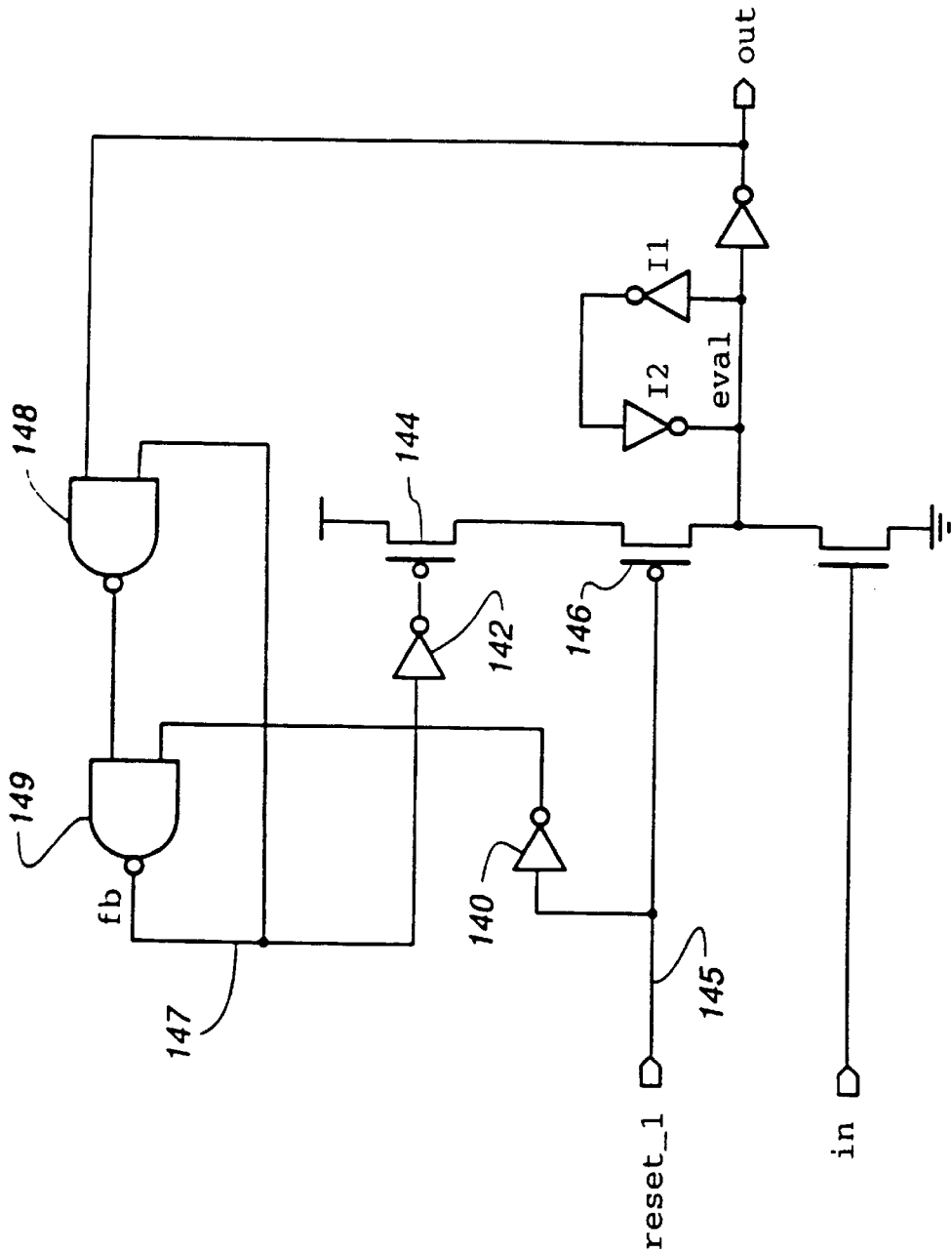
FIG. 6 illustrates a circuit in accordance with another embodiment of the present invention to improve the circuit's response time to the reset input and where the double feedback is provided along the reset input to prevent multiple resets from occurring in a single cycle.

FIG. 6 illustrates a circuit in accordance with another embodiment of the present invention to improve the circuit's response time to the reset input signal 145 and where the double feedback is provided along the reset input to prevent multiple resets from occurring in a single cycle. FIG. 6 illustrates the circuit of FIG. 2 wherein the NAND gate 68 and transistor 54 (FIG. 2) have been replaced by inverters 140, 142, and transistors 144 and 146 (FIG. 6). In FIG. 2, the RESET signal 70 needs to propagate through NAND gate 68 in order to activate transistor 54. In the circuit shown in FIG. 6, the RESET_1 signal 145 is directly coupled to activate transistor 146, thereby permitting faster activation of the reset function of the circuit. The second feedback path shown in FIG. 6 is formed by tapping off feedback signal 147 into NAND gate 148 into NAND gate 149 along feedback signal 147 through INVERTER 142 to drive transistor 144. The RESET_1 signal 145 is also tapped and coupled through INVERTER 140 to an input of NAND gate 149.

Therefore, the circuit shown in FIG. 6 may provide even faster performance and may be better suited for high frequency applications than the circuit shown in FIG. 2, while still preventing multiple resets from occurring in a single cycle of the circuit in accordance with the present invention.

Figure 7:
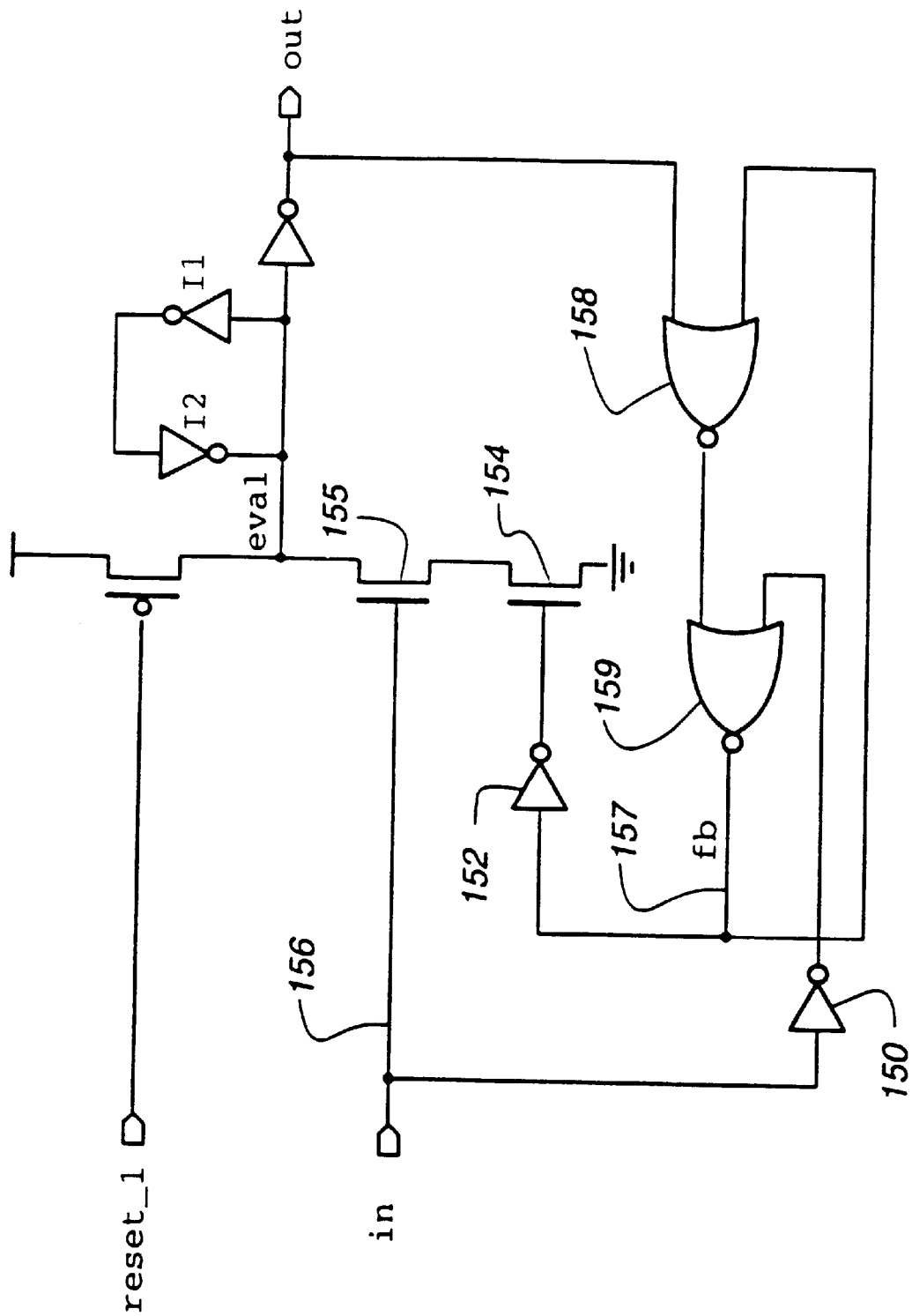
FIG. 7 illustrates a circuit in accordance with another embodiment of the present invention to improve the circuit's response time to input data and where the double feedback is provided along the data input to prevent multiple evaluates from occurring in a single cycle.

FIG. 7 illustrates a circuit in accordance with another embodiment of the present invention to improve the circuit's response time to the data input signal 156 and where double feedback is provided along the data input to prevent multiple evaluates from occurring in a single cycle. FIG. 7 illustrates the circuit of FIG. 4 wherein the NOR gate 84 and transistor 82 (FIG. 4) have been replaced by inverters 150, 152, and transistors 154 and 155. In FIG. 4, the SET_1 signal 80 needs to propagate through NOR gate 84 in order to activate transistor 82. In the circuit shown in FIG. 7, the IN signal 156 is directly coupled to activate transistor 155, thereby permitting faster activation of the circuit in response to the input signal on the input line 156. The second feedback path shown in FIG. 7 is formed by tapping off feedback signal 57 into NOR gate 158 into NOR gate 159 along signal 157 through INVERTER 152 to drive transistor 154. The IN signal 156 is also tapped and coupled through INVERTER 150 to an input of NOR gate 159.

Therefore, the circuit shown in FIG. 7 may provide a further improvement and may be better suited for high frequency applications than the circuit shown in FIG. 4, while still preventing multiple sets/evaluates from occurring in a single cycle of the circuit in accordance with the present invention.

Figure 8:
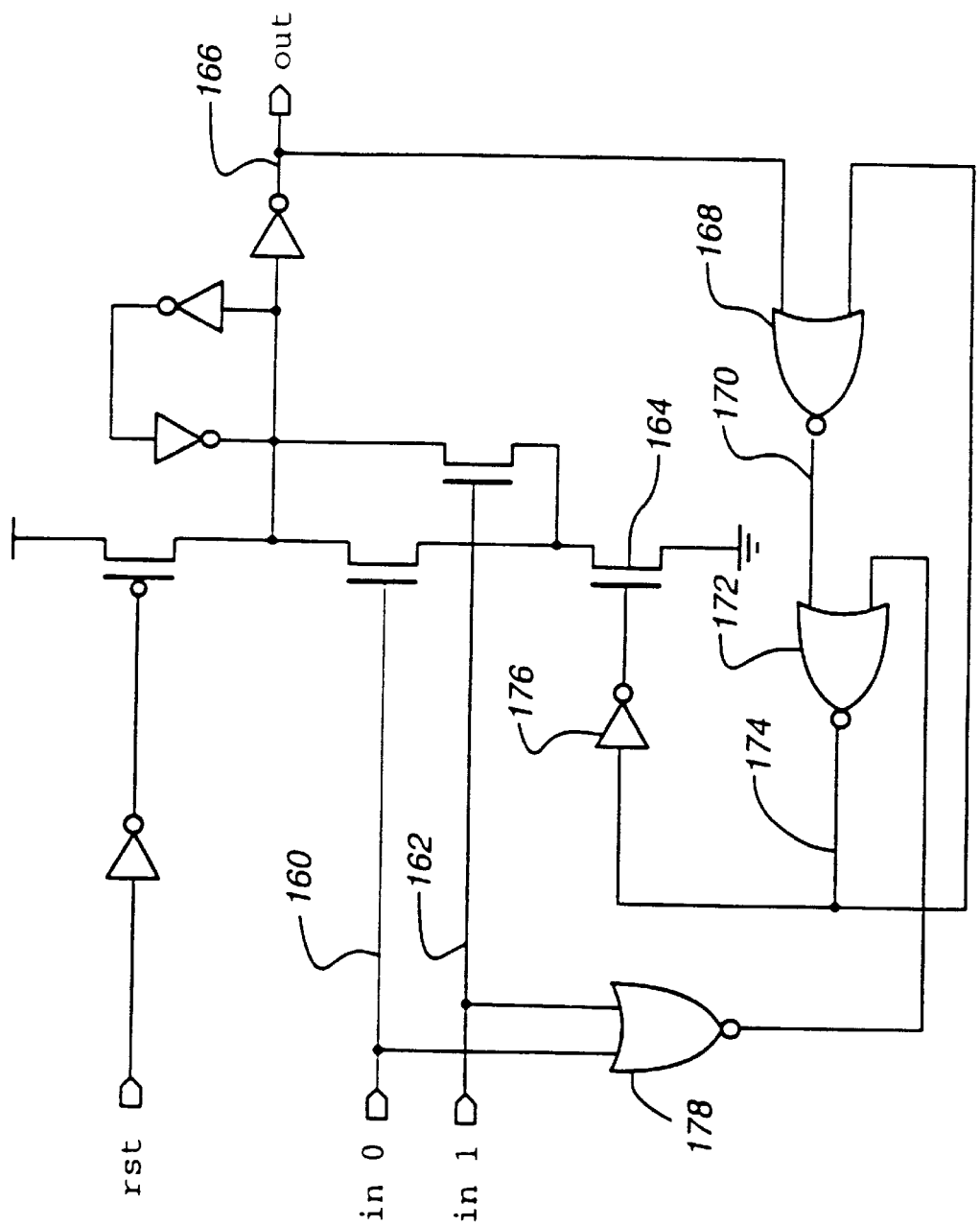
FIG. 8 illustrates a circuit in accordance with another embodiment of the present invention where a dynamic set/reset circuit is used to form a two-input OR logic circuit having a double feedback to prevent multiple evaluates from occurring in a single cycle.

FIG. 8 illustrates a circuit in accordance with another embodiment of the present invention where a dynamic set/reset circuit is used to form a two-input OR logic circuit having double feedback to prevent multiple evaluates from occurring in a single cycle. Based on the logic levels of the input signal 160 and 162, the circuit of FIG. 8 provides an output signal 166 which is a logical OR function of inputs 160 and 162 (i.e., output signal 166 is active if either input signal 160 or 162 is active). The double feedback is applied to the input signals 160, 162 of the circuit to prevent transistor 164 from being set more than once per cycle of the circuit.

As shown in FIG. 8, a first feedback path is provided to increase the frequency of the circuit, and is formed from the output signal 166 through NOR gate 168 along line 170 through NOR gate 172 along line 174 into INVERTER 176, coupled to transistor 164. A second feedback path is provided to eliminate the multiple set/evaluate problem during a single cycle of the circuit, and is formed by tapping off the feedback signal 174 into NOR gate 168, along line 170 through NOR gate 172 along feedback signal 174 into INVERTER 176 which drives transistor 164. The IN0 and IN1 lines 160, 162 are also tapped through NOR gate 178 and coupled to an input of NOR gate 172. This second feedback path ensures that transistor 164 is not activated more than once per cycle of the circuit.

Figure 9:
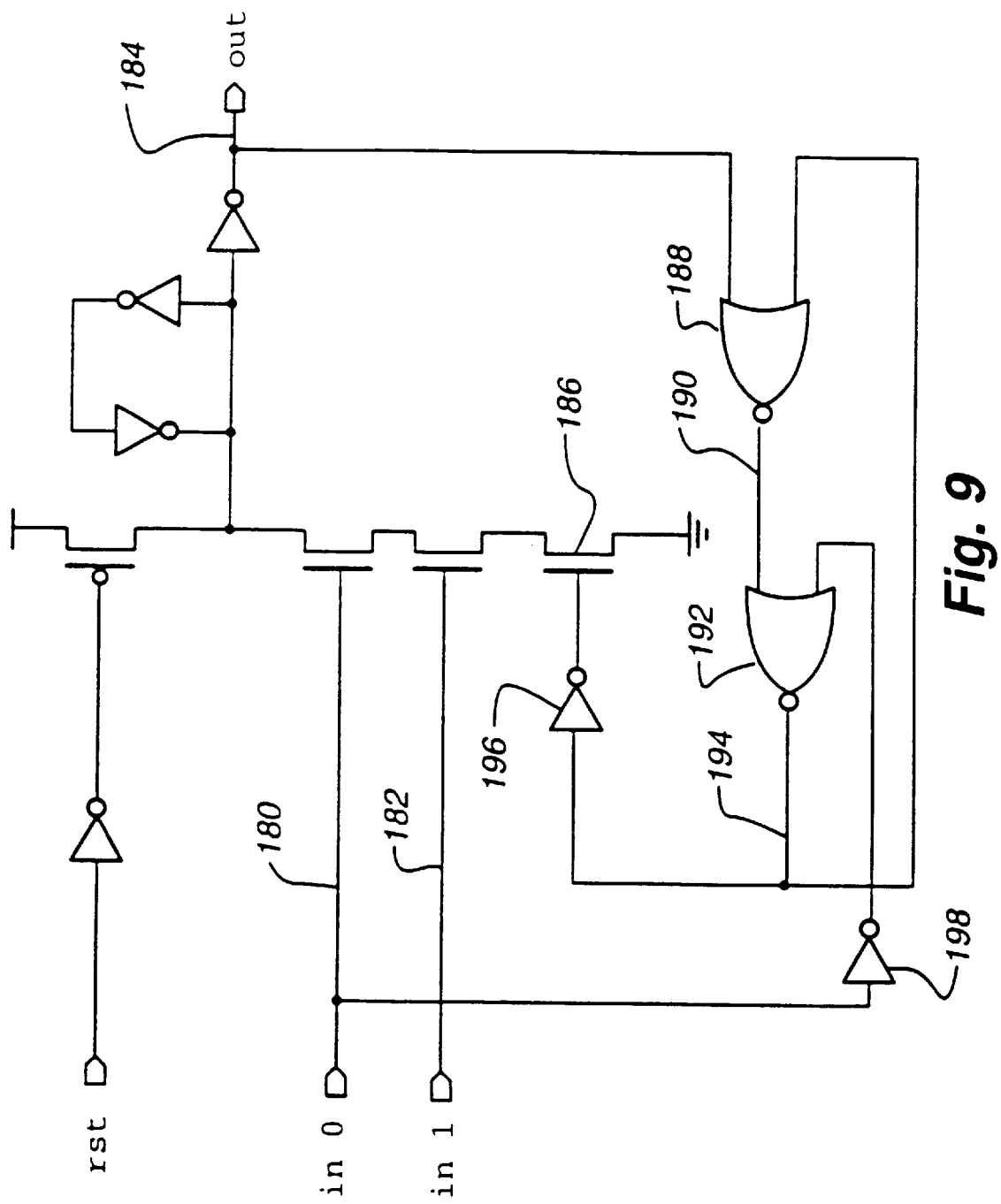
FIG. 9 illustrates a circuit in accordance with another embodiment of the present invention where a dynamic set/reset circuit is used to form a two-input AND logic circuit having a double feedback to prevent multiple evaluates from occurring in a single cycle.

FIG. 9 illustrates a circuit in accordance with another embodiment of the present invention where a dynamic set/reset circuit is used to form a two-input AND logic circuit having a double feedback to prevent multiple evaluates from occurring in a single cycle. Based on the logic levels of the input signals 180 and 182, the circuit of FIG. 9 provides an output signal 184 which is a logical AND function of inputs 180 and 182 (i.e., output signal 184 is active if both input signals 180 and 182 are active). The double feedback is applied to the input signals 180, 182 of the circuit to prevent transistor 186 from being set more than once per cycle of the circuit.

As shown in FIG. 9, a first feedback path is provided to increase the frequency of the circuit, and is formed from the output signal 184 through NOR gate 188 along line 190 through NOR gate 192 along line 194 into INVERTER 196, coupled to transistor 186. A second feedback path is provided to eliminate the multiple set/evaluate problem during a single cycle of the circuit, and is formed by tapping off the feedback signal 194 into NOR gate 188, along line 190 through NOR gate 192 along signal 194 into INVERTER 196 which drives transistor 186. The IN0 line 180 is also tapped through INVERTER 198 and coupled to an input of NOR gate 192. This second feedback path ensures that transistor 186 is not activated more than once per cycle of the circuit.

Hence as shown and described above, the various embodiments of the present invention provides a robust dynamic set/reset circuit suitable for high frequency applications where variations in the pulse widths of input signals are processed without causing an error in the circuit's operation.

While the invention has been particularly shown and described with reference to a preferred embodiment thereof, it will be understood by those skilled in the art that various other changes in the form and details may be made without departing from the spirit and scope of the invention.

What is claimed is:

1. A circuit implementing an OR logic function with a first and second input signal, comprising:

a first switching device having a gate receiving a reset signal, a source coupled to a supply line of the circuit, and a drain;

a second switching device having a gate receiving said first input signal, a drain coupled to the drain of said first switching device at a first node, and a source, said first node providing an output signal;

a third switching device having a gate receiving said second input signal, a drain coupled to said first node, and a source;

a fourth switching device having a gate, a drain coupled to the source of said second switching device and to the source of said third switching device, and a source coupled to ground;

a first logic gate having a first input receiving said output signal, a second input, and an output;

a second logic gate having a first input coupled to the output of said first logic gate, a second input, and an output;

an inverter coupling the gate of said fourth switching device to the output of said second logic gate and to the second input of said first logic gate;

a third logic gate having a first input coupled to the first input signal, a second input coupled to said second input signal, and an output coupled to said second input of said second logic gate, whereby said output signal is active when either the first or second input signals are active.

2. The circuit of claim 1, wherein said first switching device is a p-channel MOSFET.

3. The circuit of claim 1, wherein said second, third and fourth switching devices are a n-channel MOSFETs.

4. The circuit of claim 1, wherein said first, second, and third logic gates are NOR gates.

5. The circuit of claim 1, further comprising a second inverter coupled from said first node to the output signal.

6. The circuit of claim 1, further comprising a second inverter coupled from said first node to a third inverter, said third inverter coupled to said first node.

7. A circuit implementing an AND logic function with a first and second input signal, comprising:

a first switching device having a gate receiving a reset signal, a source coupled to a supply line of the circuit, and a drain;

a second switching device having a gate receiving said first input signal, a drain coupled to the drain of said first switching device at a first node, and a source, said first node providing an output signal;

a third switching device having a gate receiving said second input signal, a drain coupled to said source of the second switching device, and a source;

a fourth switching device having a gate, a drain coupled to the source of said third switching device, and a source coupled to ground;

a first logic gate having a first input coupled to said output signal, a second input, and an output;

a second logic gate having a first input coupled to the output of said first logic gate, a second input, and an output;

a first inverter coupling the gate of said fourth switching device to the output of said second logic gate and to the second input of said first logic gate;

a second inverter coupling the first input signal to said second input of said second logic gate, whereby said output signal is active when the first input signal and the second input signals are active.

8. The circuit of claim 7, wherein said first switching device is a p-channel MOSFET.

9. The circuit of claim 7, wherein said second, third and fourth switching devices are n-channel MOSFETs.

10. The circuit of claim 7, wherein said first, and second logic gates are NOR gates.

11. The circuit of claim 7, further comprising a third inverter coupled from said first node to the output signal.

12. The circuit of claim 7, further comprising a third inverter coupled from said first node to a fourth inverter, said fourth inverter coupled to said first node.

* * * * *